(12) United States Patent
Tran et al.

(10) Patent No.: US 6,423,575 B1
(45) Date of Patent: Jul. 23, 2002

(54) HYDROGEN GETTERING STRUCTURE INCLUDING SILVER-DOPED PALLADIUM LAYER TO INCREASE HYDROGEN GETTERING OF MODULE COMPONENT AND SEMICONDUCTOR DEVICE MODULE HAVING SUCH STRUCTURE, AND METHODS OF FABRICATION

(76) Inventors: Dean Tran, 9331 Coronet Ave., Westminster, CA (US) 92683; Jerry T. Fang, 2612 Palos Verdes Dr. West, Palos Verdes Estates, CA (US) 90274

( * ) Notice: Subject to any disclaimer, the term of this patent is extended or adjusted under 35 U.S.C. 154(b) by 0 days.

(21) Appl. No.: 09/917,318

(22) Filed: Jul. 27, 2001

(51) Int. Cl.[7] .................. H01L 23/20; H01L 21/44; H01L 21/48; H01L 21/50

(52) U.S. Cl. ........................ 438/115; 257/682

(58) Field of Search ................... 438/115; 257/682

(56) References Cited

U.S. PATENT DOCUMENTS

| | | | | |
|---|---|---|---|---|
| 5,491,361 A | * | 2/1996 | Stupian et al. | 257/680 |
| 5,543,364 A | * | 8/1996 | Stupian et al. | 438/115 |

* cited by examiner

*Primary Examiner*—David E. Graybill
(74) *Attorney, Agent, or Firm*—Antonelli, Terry, Stout & Krause, LLP

(57) ABSTRACT

Disclosed are hydrogen gettering structure (11) and use of such structure and methods of forming such structure. The hydrogen gettering structure (11) includes a titanium member (1) and a silver-doped palladium layer (3) on the titanium member (1), the silver assisting palladium to increase the hydrogen gettering. The silver-doped palladium can be deposited on the titanium member by sputtering. The hydrogen gettering structure (11) can be attached to a semiconductor module component (7) and incorporated in a semiconductor module (10) to increase hydrogen gettering, or can be included in other structure (e.g., nuclear reactor structure) where absorption or gettering of hydrogen is necessary or desired.

57 Claims, 3 Drawing Sheets

HYDROGEN GETTERING STRUCTURE INCLUDING SILVER-DOPED PALLADIUM LAYER TO INCREASE HYDROGEN GETTERING OF MODULE COMPONENT AND SEMICONDUCTOR DEVICE MODULE HAVING SUCH STRUCTURE, AND METHODS OF FABRICATION

BACKGROUND OF THE INVENTION

1. Field of the Invention

The present invention is directed to hydrogen gettering structure including a titanium member (in particular, a titanium bulk member); to packaging (module) components (for example, a lid, a container, etc.) for packaging semiconductor devices (for example, microelectronic semiconductor devices) and packages (modules) formed, including the hydrogen gettering structure (for example, a semiconductor device module containing the hydrogen gettering structure); and to methods of forming the hydrogen gettering structure and packaging components and packages. The present invention is especially directed to hydrogen gettering structure, and module components and modules having such structure, and methods for forming such structure and components and modules, which avoid damage and degradation of articles (for example, semiconductor devices containing III-V semiconductor materials) contained in such modules, due to hydrogen in the modules.

Thus, the present invention is particularly directed to hydrogen gettering structure, and components and modules using such hydrogen gettering structure, which avoid damage and degradation of articles sought to be protected from hydrogen in the environment of the article. For example, the present invention is directed to hydrogen gettering structure, and to module components and modules, which avoid hydrogen degradation of semiconductor devices in the modules, particularly those devices having a low threshold hydrogen level in hermetic (air-tightly sealed) packages.

More generally, the present invention is directed to hydrogen gettering structure having a bulk getter for absorbing hydrogen. While the present invention will be described primarily in connection with hydrogen gettering structure for packaged semiconductor devices, the present invention is not limited thereto, and can be utilized in connection with other structure in which hydrogen gettering is necessary and/or desired (for example, nuclear reactor structure).

2. Discussion of the Related Art

A problem experienced by semiconductor manufacturers, in connection with packaged semiconductor devices, is hydrogen degradation of the devices in hermetically sealed packages. The hydrogen within the packages can be generated from various parts of a package, for example, from housing materials, plated nickel layers, Eccosorb (a material used in semiconductor packages of, e.g., millimeter wave integrated circuits (MMICs), to absorb electrical signals), epoxy adhesives, etc.

It has been proposed to mitigate the problem of hydrogen degradation by baking out housing materials prior to populating the semiconductor device in the package and hermetically sealing. While this has been successful in some instances, such technique to mitigate the problem of hydrogen degradation has not been sufficient, particularly with devices having a low hydrogen threshold level.

Another technique for overcoming this problem with hydrogen degradation involves suspending inorganic hydrogen-absorbing material in silicone, in the device package. The inorganic hydrogen absorption material can be any of known metal oxide hydrogen getters. However, this technique has problems when utilized in packaging, e.g., microelectronic devices. For example, the material used undesirably takes up a large amount of moisture, requiring careful handling during the package sealing process. In addition, silicone may vaporize and contaminate electronic device and laser seal surfaces, and additional problems arise with the packaged device due to mobile impurity ions introduced due to including this hydrogen-absorbing material in silicone in the device package.

U.S. Pat. No. 6,110,808 to Saito discloses another technique for gettering hydrogen in semiconductor packages. This technique includes sequentially depositing metal layers on a package component, the sequentially deposited metal layers including palladium as the outermost layer and zirconium or titanium adjacent thereto. The contents of U.S. Pat. No. 6,110,808 are incorporated herein by reference in their entirety.

While this technique in U.S. Pat. No. 6,110,808 provides hydrogen gettering, a problem exists that in forming, e.g., titanium hydrides to achieve the hydrogen gettering (that is, achieve absorption of hydrogen), the titanium hydride increases in volume and can cause a problem that the layers fall off the package component.

U.S. patent application Ser. No. 09/415,513, filed Oct. 8, 1999, the contents of which are incorporated herein by reference in their entirety, discloses a hydrogen gettering element, which is a bulk gettering element. This element includes a bulk member of titanium, which has an outer surface that is substantially free from oxide, secured to one of the interior surfaces of a package component. This patent application discloses that a thin layer of palladium can be formed on the outer surface of the titanium, to prevent the titanium from oxidizing. Hydrogen atoms in the interior of the housing chemically combine with the titanium, such that the interior of the housing is substantially free from hydrogen, thus improving electrical properties and life of the microelectronics device within the package.

While the foregoing techniques have been utilized for hydrogen gettering, it is desired to provide structure achieving improved and increased hydrogen gettering, in structure which is stably provided in the interior of, e.g., a semiconductor package, and which can be simply and inexpensively manufactured.

SUMMARY OF THE INVENTION

Applicants have developed hydrogen gettering structure providing increased hydrogen gettering, while being easily manufactured and being inexpensive. Applicants have found that structure including a member of a metal for absorbing hydrogen, with a metal-doped palladium layer on a surface thereof, the metal dopant being selected from the group consisting of silver, rubidium and rhodium and being included in an amount sufficiently low such that the metal dopant does not form an alloy with the palladium, the metal for absorbing hydrogen being different than palladium, provides a simple and effective hydrogen gettering element, while being inexpensive and easy to manufacture. This hydrogen gettering structure, for example, when utilized in connection with a packaged semiconductor device (semiconductor device module), is included within the package (module) and attached to a package component (for example, a lid of the package), with the member of the metal for absorbing hydrogen being closer to the package component than the metal-doped palladium layer (for example, the metaldoped palladium layer being exposed to the interior of the package). Illustratively, and not to be limiting, the metal for absorbing hydrogen can desirably be titanium (or zirconium), and the metal-doped palladium layer includes at least 0.1% by weight of the metal dopant (for example, and not to be limiting, includes 0.1%–10% by weight of the metal dopant).

According to the present invention, and not to be limiting thereof, by doping, e.g., silver (Ag:4 $d^{10}$ 5 $s^1$) into palladium (Pd:4 $d^{10}$), the 5 $s^1$ energy state of silver, which contains 1 electron, will activate the 5 $s^0$ empty energy state of palladium and the 4 $p^0$ empty energy state of palladium. These energy states will hybridize to form 10 $s^{0.5}$ $p^1$ $d^{1.4}$ hybrid energy states. In each hybrid energy state, the hybrid electron will couple with one electron of hydrogen to increase the hydrogen holding lifetime. Following this, the hydrogen atoms will be transferred to the, e.g., titanium underlayer because the titanium has a lower energy state, and the hydrogen is then converted to titanium hydride in the titanium underlayer, forming a stable titanium hydride. Using the, e.g., silver-doped palladium, hydrogen gettering capacity of palladium increases at least 10 times as compared to using pure palladium, as a surface coating on the titanium.

As indicated previously, III-V semiconductor materials, as well as related materials, are very sensitive to hydrogen. Modules (packages) such as photonics transmitters, receivers, and ultra-high speed/large bandwidth DWDM (dense wavelength division multiplexing) modules for wireless communications contain III-V semiconductor materials and related MMIC chips (such as semiconductor lasers, photodetectors, low noise amplifiers (LNAs) and transimpedance amplifiers (TIAs)). Hydrogen residue in the sealed modules increase surface ion migration on the chips during operation, causing degraded performance and reduced life. By incorporating the hydrogen gettering structure according to the present invention in such modules, degradation of device performance and reduction of device life due to hydrogen is reduced, to improve device performance and reliability.

Thus, according to the present invention, the above-described hydrogen gettering structure, containing, for example, a titanium bulk member and a layer of, e.g., silver-doped palladium on the surface thereof, can be affixed to a module component and incorporated in the module to provide hydrogen gettering, improving device performance and reliability. The hydrogen gettering structure of the present invention can also be incorporated in various other structures where hydrogen gettering is necessary or desired (for example, in nuclear reactor structure).

According to the present invention, the hydrogen gettering structure according to the present invention can be easily and inexpensively manufactured. For example, a bulk member (e.g., sheet) of the metal for absorbing hydrogen (for example, titanium), can be provided, and a metal-doped palladium layer, the metal dopant being, for example, silver, rubidium and/or rhodium, deposited on the member of the metal for absorbing hydrogen. The deposition of the metal-doped palladium layer can be achieved by, e.g., sputtering, using, for example, a target of palladium and the metal dopant. Other techniques for depositing the metal-doped palladium layer can also be utilized, including, but not limited to, vacuum evaporation (for example, electron beam evaporation). Prior to depositing the metal-doped palladium layer, it is effective to clean the titanium bulk member (e.g., titanium metal sheet), and to remove the top titanium oxide film so that the, e.g., silver-doped palladium layer is deposited in direct contact with the titanium.

According to the present invention, the hydrogen gettering structure can be affixed to the module component by any of various techniques, including soldering or via an epoxy resin layer (epoxy adhesive).

Accordingly, by the present invention, hydrogen gettering structure is provided having improved gettering, and which can easily and effectively be manufactured at low cost, providing increased hydrogen gettering capacity of the titanium bulk member. Incorporating such hydrogen gettering structure in a packaged semiconductor module, device performance and reliability are improved.

DETAILED DESCRIPTION OF PREFERRED EMBODIMENTS

Figure 1:
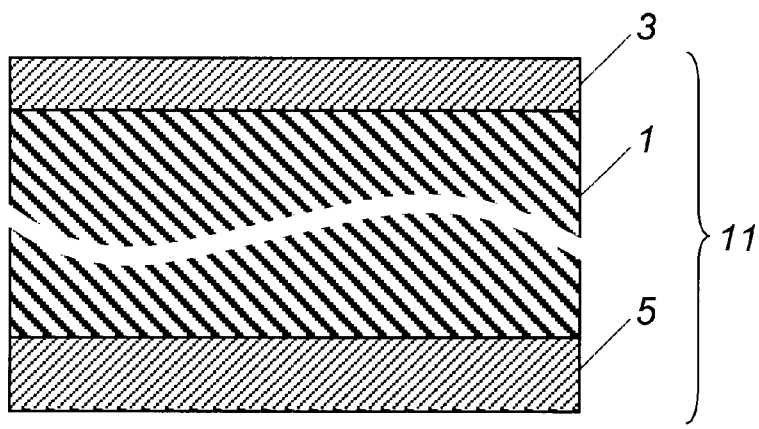
FIG. 1 is a cross-section of hydrogen gettering structure according to aspects of the present invention.

In the following detailed description, like reference numerals and characters may be used to designate identical, corresponding, or similar components in differing drawing figures. Furthermore, in the detailed description to follow, example sizes/models/values/ranges may be given, although the present invention is not limited thereto. Well-known power connections and other well-known elements have not been shown within the drawing figures for simplicity of illustration and discussion and so as not to obscure the invention.

While the present invention will be described in connection with specific and preferred embodiments, it will be understood that it is not intended to limit the invention to those embodiments. To the contrary, the present invention is intended to cover all alterations, modifications and equivalents as may be included within the spirit and scope of the invention as defined by the appended claims.

Throughout the present specification, where structure or processing steps are described as including or comprising specific components or processing steps, it is contemplated by the present inventors that this structure also consists essentially of, or consists of, the recited components; and that the process also consists essentially of, or consists of, the recited processing steps. Accordingly, throughout the present disclosure any described structure can consist essentially of, or consist of, the recited components; and any described process can consist essentially of, or consist of, the recited processing steps.

Any reference in the present description to "one embodiment", "an embodiment", "example embodiment", etc., means that a particular feature, structure or characteristic described in connection with the embodiment is included in at least one embodiment or aspect of the invention. The appearances of such phrases in various places in the specification are not necessarily all referring to the same embodiment. Further, when a particular feature, structure, or characteristic is described in connection with any embodiment, such feature, structure or characteristic can be effected in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

The present invention contemplates hydrogen gettering structure, which includes, e.g., (1) a bulk member of a metal for absorbing hydrogen (e.g., for reacting with hydrogen), to remove hydrogen from the environment containing the hydrogen gettering structure, and (2) a metal-doped palladium layer, the metal dopant being selected from the group consisting of silver, rubidium and rhodium, provided on the bulk member of the metal for absorbing hydrogen. While not to be limiting, the metal for absorbing hydrogen can be titanium, and in the following, aspects of the present invention will be discussed in connection with utilizing titanium as the metal for absorbing hydrogen. The present invention is not limited to use of titanium, and, for example, zirconium or hafnium can also be utilized. In the following, the present invention will be discussed in terms of use of silver as the metal dopant in the palladium, although, as indicated previously, the present invention is not limited to the use of silver as the dopant.

According to aspects of the present invention, the amount of silver incorporated in the silver-doped palladium layer is desirably 0.1–10% by weight silver, to the total weight of the silver-doped palladium layer. By incorporating a maximum of 10% by weight silver, a state of an alloy of palladium and silver, rather than silver-doped palladium, is avoided, and also oxidation of the silver can be avoided. By utilizing at least 0.1% by weight silver, a sufficient amount of hybridized electron orbitals (electrons shared between orbitals) is achieved, to provide desired increase in hydrogen gettering. Preferably, the amount of silver incorporated in the palladium is 0.2–1% by weight silver, to the total weight of the layer, and most preferred is 0.5% by weight silver.

The titanium member can be a bulk member, e.g., a sheet of titanium. By utilizing such bulk member of titanium, sufficient capacity of titanium for absorbing hydrogen (for example, sufficient titanium to absorb large amounts of hydrogen, reacting with the titanium to form titanium hydride) is achieved. When using the hydrogen gettering structure according to aspects of the present invention in a small package (for example, in a package for a small device), the bulk titanium member can be a sheet having a thickness of, e.g., 5–20 mils. When utilizing the hydrogen gettering structure in a relatively large package (e.g., for a large semiconductor device), a sheet of titanium can be used having a thickness of, e.g., 5 mils–3 mm.

The silver-doped palladium layer, illustratively, has a thickness of 200Å–1 µm, preferably, 200 Å to 5000 Å. As an illustrative embodiment, and not to be limiting, the silver-doped palladium layer has a thickness of 1000 Å. Desirably, and not to be limiting, the silver is doped uniformly throughout the silver-doped palladium layer.

As will be discussed further in the following, the silver-doped palladium layer can be formed on the titanium member by any of various techniques known in the art. For example, sputtering can be used. Vacuum evaporation techniques, such as electron beam evaporation, can also be used.

The hydrogen gettering structure according to the present invention can be positioned at various locations within a module containing the semiconductor device. For example, the hydrogen gettering structure can be affixed to any available place in the package housing.

Various techniques for affixing the hydrogen gettering structure to the module component can be utilized. For example, the silver-doped palladium layer/bulk titanium hydrogen getter can be affixed to, e.g., a lid, such that in the formed module the hydrogen gettering structure on the lid is exposed to the interior of the module, by epoxy adhesive, or by soldering, or by welding (laser weld, direct current weld, etc.) the hydrogen gettering structure to the lid or any available place in the package housing.

As a further embodiment according to aspects of the present invention, a gold layer (illustratively, and not to be limiting, of a thickness of 2000 Å to 10,000 Å) can be provided on the side of the titanium sheet opposite the side thereof having the silver-doped palladium layer thereon, with the gold film being provided for mounting the hydrogen gettering structure on the module component.

FIG. 1 shows hydrogen gettering structure according to an aspect of the present invention. Shown in FIG. 1 is hydrogen gettering structure 11, having titanium sheet 1 as a titanium bulk member. On one side of titanium sheet 1 is silver-doped palladium layer 3; and on the opposite side of titanium sheet 1 is gold layer 5, provided for mounting. This provides the finished hydrogen getter.

Figure 2:
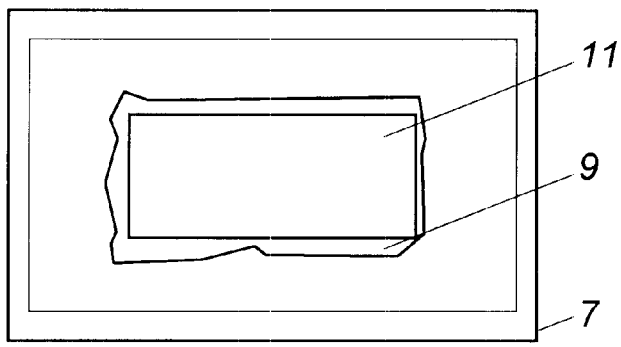
FIG. 2 is a plan view of hydrogen gettering structure attached to a module (package) component of a semiconductor device module, according to aspects of the present invention.

Shown in FIG. 2 is a plan view of hydrogen gettering structure 11 mounted in a module package, according to an aspect of the present invention. Seen in FIG. 2, is hydrogen gettering structure 11, attached to available area 7 of a module for packaging a semiconductor device. Hydrogen gettering structure 11 is mounted on available area 7 by solder 9, which can be an eutectic or regular/fluxless, resinless, saltless solder. The hydrogen gettering structure 11 can be mounted on available area in the package housing by laser welding or direct current welding (thermal welding), etc.

Figure 3:
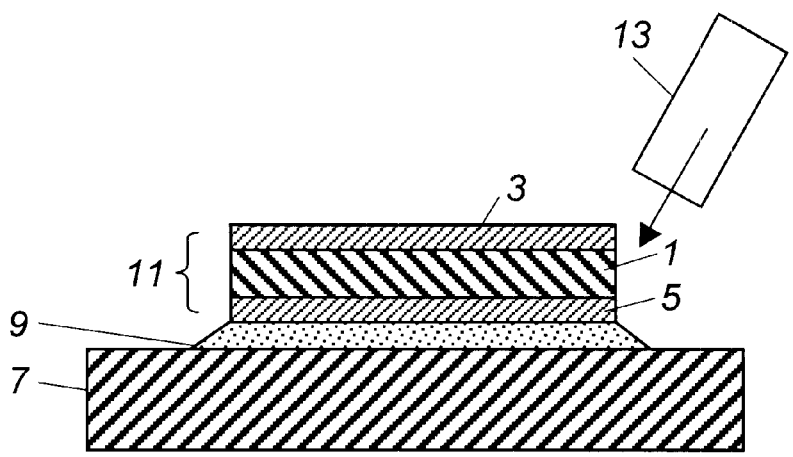
FIG. 3 is a cross-section of structure showing hydrogen gettering structure attached to a module component according to the present invention, and schematically showing a technique for affixing the hydrogen gettering structure to the module component, according to aspects of the present invention.

FIG. 3 is a cross-sectional view showing hydrogen gettering structure 11 mounted on available area 7 in the package housing through use of solder 9. As can be seen in FIG. 3, hydrogen gettering structure 11 is affixed to lid 7 via solder 9, with gold layer 5 being in contact with solder 9 and silver-doped palladium layer 3 being positioned so as to be exposed to the inside of the formed module.

Also shown in FIG. 3 is hot inert gas nozzle 13. Hot inert gas nozzle 13 applies heat to solder 9 so as to provide the necessary affixing of hydrogen gettering structure 11 to area 7.

Particularly as seen in the cross-sectional views in FIGS. 1 and 3, a single layer of silver-doped palladium can be provided on the titanium bulk member, in forming hydrogen gettering structure 11 according to various aspects of the present invention. That is, a single titanium bulk member and single silver-doped palladium layer can be utilized, providing sufficient amount of titanium for absorbing necessary amounts of hydrogen.

Figure 4:
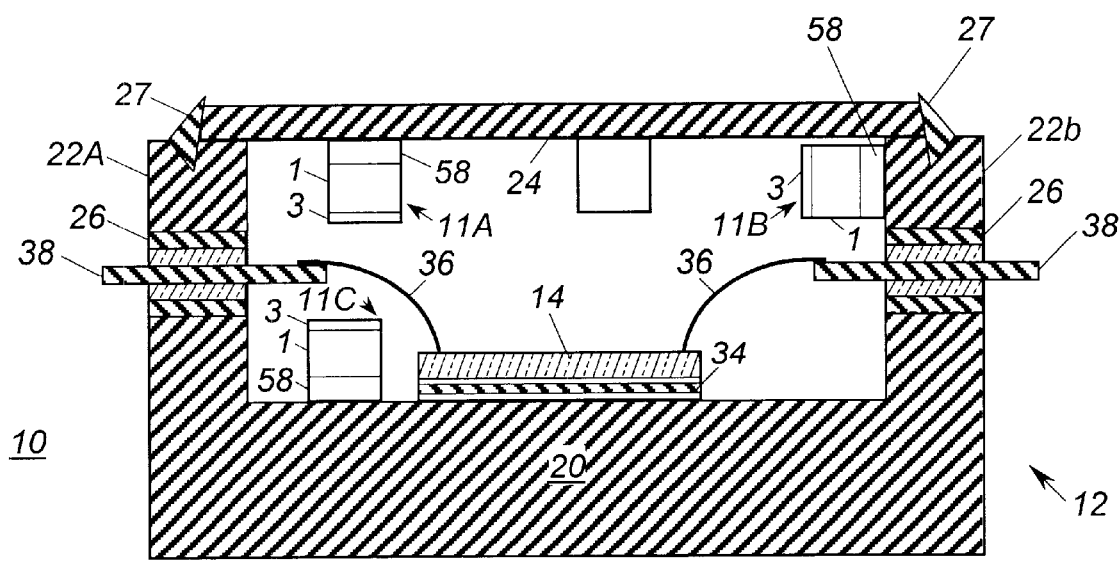
FIG. 4 is a cross-section of a semiconductor device module incorporating hydrogen gettering structure, according to aspects of the present invention.

FIG. 4 shows a module according to aspects of the present invention. This module, generally indicated by numeral 10, is an integrated microelectronics module and comprises a housing 12, a microelectronics chip 14 and bulk getter elements 11A, 11B and 11C. Each of bulk getter elements 11A, 11B and 11C includes titanium member 1 and silver-doped palladium layer 3.

The conventional housing 12 includes a base 20, four side walls and a lid 24 that are formed from a metallic material. The housing 12 has a block shape, and is more particularly a parallelepiped. Base 20, side walls (including opposed side walls 22A and 22B) and lid 24 form a plurality of flat interior surfaces that define an interior of the housing.

Base 20 has a rectangular shape in plan view. Four side walls are also rectangular with opposed side walls 22A and 22B having openings 26 therethrough so as to form an electrical feedthrough.

Lid 24 is secured to the side walls with laser welds 27 around its periphery. The laser welds 27 create a metal-to-metal hermetic seal, that is vacuum-tight, so that hydrogen in the external environment cannot seep into the housing.

Wires 36, preferably made of gold, extend from input and output conductive pads on microelectronics chip 14. Electrical feedthrough leads 38 are exposed to the openings 26 in the side walls and serve to conduct electrical power, and input and output signals, to and from microelectronics chip 14.

As seen in FIG. 4, three hydrogen gettering structures, 11A, 11B and 11C, are provided respectively on the lid, side wall and base of module 10. Each hydrogen getter structure 11A, 11B and 11C includes silver-doped palladium layer 3 and titanium bulk member 1. Each of bulk elements 11A, 11B and 11C are secured to an interior surface of module 10 with epoxy resin adhesive 58 or welded to the available area in the housing by laser welding, direct current welding technique.

The hydrogen gettering structure according to the present invention can be made utilizing various known techniques, such as sputtering or electronic beam evaporation. For example, in the following a sputtering technique, for forming the hydrogen gettering structure according to various aspects of the present invention, will be described. This sputtering technique described is illustrative and not limiting of the present invention. Thus, using a titanium metal sheet (with purity from 99% to 99.95%, preferred 99.5%), which is 10 mils thick, the sheet is cut to a size fitting the packaging need. The cut sheet is wet-cleaned with isopropanol, a hydrofluoric-nitric acid ($HF/HNO_3$) mixture, rinsed with isopropanol and blown dry with nitrogen. Thereafter, the cleaned structure is loaded into a sputtering system, with ion milling then being performed to remove a top film of titanium oxide. Thereafter, the silver-doped palladium layer ($Pd_{gg.5}Ag_{0.5}$) is deposited on the titanium, by sputtering, and thereafter the structure is unloaded from the sputtering system. Illustratively, and not to be limiting, the sputtering is performed under vacuum conditions of $1.0 \times 10^{-4}$ to $1.0 \times 10^{-5}$ Torr, e.g., $1.9 \times 10^{-4}$ Torr, at a temperature in the range of 140°–200° F., e.g., 140° F. The magnetron utilized to provide power for the sputtering operates at 200 watts–300 watts, e.g., 240 watts.

Figure 5:
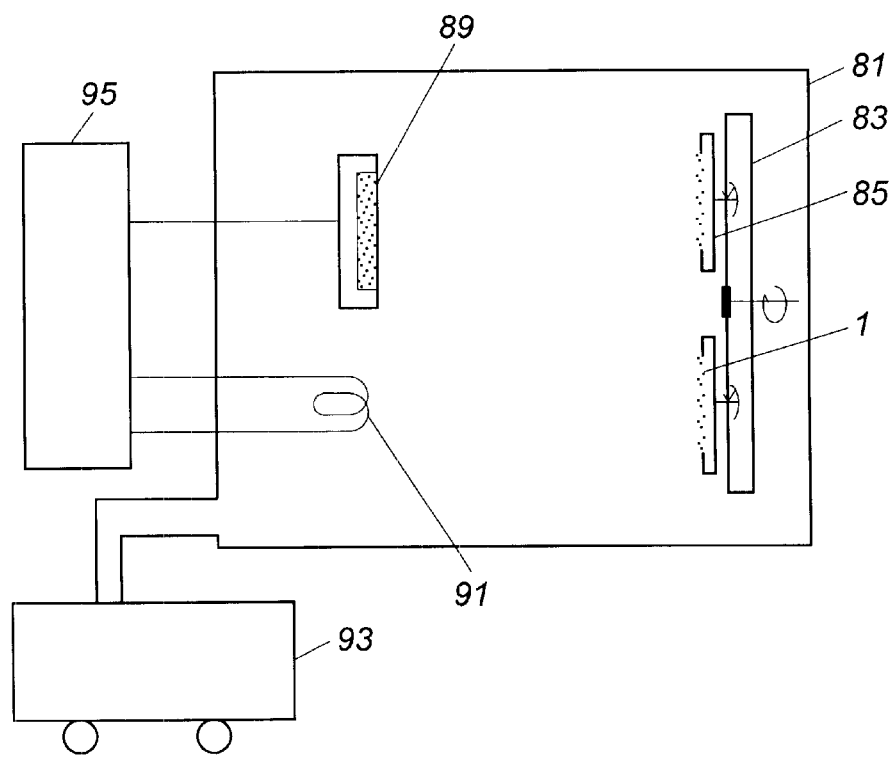
FIG. 5 schematically shows apparatus for forming hydrogen gettering structure according to aspects of the present invention.

Apparatus for performing the sputtering is illustrated in FIG. 5. Thus, shown in FIG. 5 is vacuum chamber 81, in which the sputtering is performed. Reference character 83 denotes a planetary system where the titanium sheet on a processing disk will be mounted, reference character 85 denoting the processing disk and reference character 1 denoting the titanium sheet. Also shown in FIG. 5 is palladium/silver target 89, providing the silver and palladium for forming the silver-doped palladium layer. Reference character 91 shows an ion source which provides electrons for ion etching, removing the top titanium oxide film, prior to deposition of the silver-doped palladium layer. Also shown in FIG. 5 are high vacuum pump 93 and power supply and controller 95, the high vacuum pump providing the necessary vacuum for sputter deposition, and the power supply and controller providing power both for ion milling (ion etching) and deposition.

During film deposition, each of planetary system 83 and processing disk 85 is rotated, with planetary system 83 rotating in a direction opposite that of processing disk 84 to achieve deposition uniformity.

The hydrogen gettering structure formed can be affixed to a module component (e.g., lid, side wall or bottom) by known techniques, including use of an epoxy adhesive, soldering or welding. Moreover, the sealed module can be provided according to known techniques.

Figure 6:
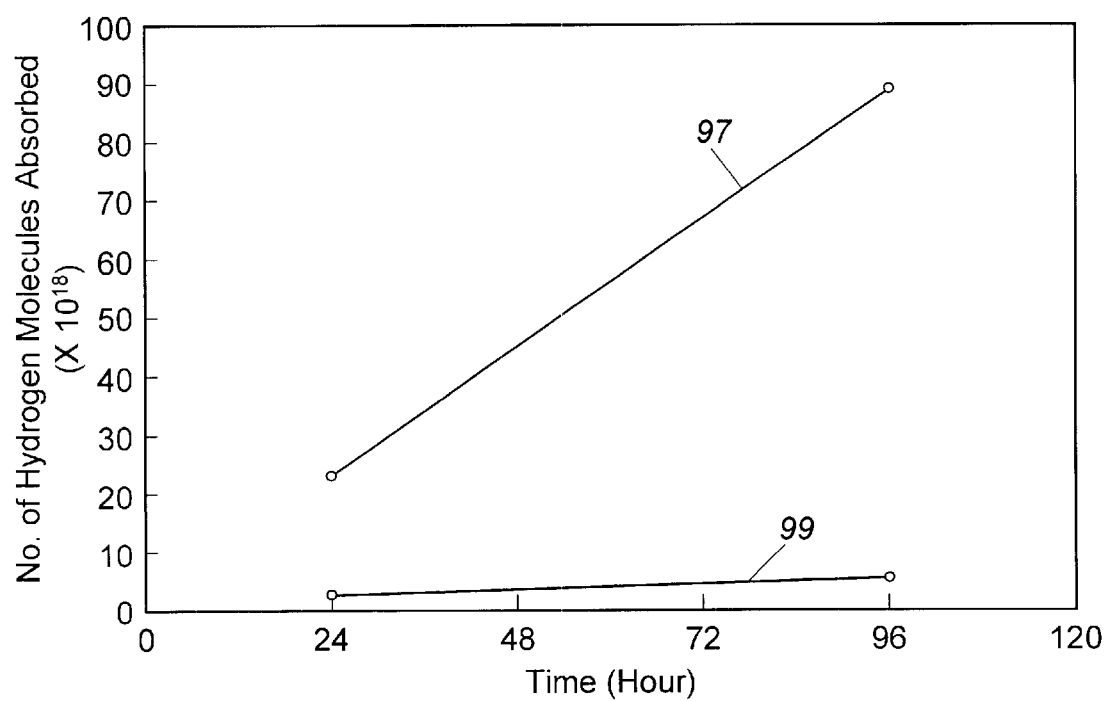
FIG. 6 is a graph of hydrogen absorbed as a function of time, for hydrogen gettering structure according to aspects of the present invention and for hydrogen gettering structure of titanium and a palladium coating layer, but without silver doped in the palladium layer.

FIG. 6 shows hydrogen getter capacity, at room temperature, of a bulk titanium member coated with palladium, as compared with hydrogen getter capacity of hydrogen gettering structure according to the present invention having a silver-doped palladium layer coated on a surface of the titanium member. The bulk titanium utilized was a 1 $cm^2$ sheet of 10 mils thickness, having a coating layer (either of palladium or of silver-doped palladium) of 1000 Å thickness. Curves 97 and 99 respectively show number of hydrogen molecules absorbed by the silver-doped palladium coated bulk titanium and by the palladium coated bulk titanium. As is clear in FIG. 6, the structure according to the present invention provides greatly improved amount of hydrogen molecules absorbed. Illustratively, and not to be limiting, with the silver-doped palladium coating on titanium, hydrogen gettering capacity can increase at least 10 times compared to using a pure palladium coating on titanium.

Thus, according to the present invention, hydrogen gettering structure is provided having increased hydrogen gettering capacity. When incorporated in a semiconductor module containing, for example, III-V semiconductor material and chips with related materials (for example, laser, photodetector, LNA, TIA, MMIC, etc.), device performance and reliability are improved. Thus, the hydrogen gettering structure according to the present invention can be inserted into ultrahigh speed and large bandwidth modules, inter alia, photonics modules, and high speed III-V chip package modules, eliminating the need for a silicon hydrogen getter and achieving improved device performance and reliability.

Although the present invention has been described with reference to illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. Hydrogen gettering structure, comprising:
   a member of a metal for absorbing hydrogen; and
   a metal-doped palladium layer on said member, the metal dopant of the metal-doped palladium layer being selected from the group consisting of silver, rubidium and rhodium and being included in an amount sufficiently low such that the metal dopant does not form an alloy with the palladium, the metal for absorbing hydrogen being different than palladium.

2. The hydrogen gettering structure according to claim 1, wherein the metal-doped palladium layer includes at least 0.1% by weight of the metal dopant.

3. The hydrogen gettering structure according to claim 2, wherein the metal-doped palladium layer includes 0.1%–10% by weight of the metal dopant.

4. The hydrogen gettering structure according to claim 2, wherein the metal for absorbing hydrogen is selected from the group consisting of titanium and zirconium.

5. The hydrogen gettering structure according to claim 4, wherein the metal for absorbing hydrogen is titanium.

6. The hydrogen gettering structure according to claim 1, wherein the metal dopant is distributed uniformly through the metal-doped palladium layer.

7. Hydrogen gettering structure, comprising:
   a titanium member; and
   a silver-doped palladium layer provided on the titanium member, wherein the silver-doped palladium layer contains 0.1 to 10% by weight silver.

8. The hydrogen gettering structure according to claim 7, wherein the silver-doped palladium layer includes 0.2 to 1% by weight silver.

9. The hydrogen gettering structure according to claim 7, wherein the silver-doped palladium layer includes 0.5% by weight silver.

10. The hydrogen gettering structure according to claim 7, wherein the titanium member is a titanium sheet, having the silver-doped palladium layer on one side thereof.

11. The hydrogen gettering structure according to claim 10, wherein the titanium sheet has a gold layer on the side thereof opposite said one side.

12. The hydrogen gettering structure according to claim 10, wherein the titanium sheet has a thickness of 5 mil to 3 mm.

13. The hydrogen gettering structure according to claim 12, wherein the silver-doped palladium layer has a thickness of 200 Å to 1 $\mu$m.

14. The hydrogen gettering structure according to claim 10, wherein the titanium sheet has a thickness of 5–20 mils.

15. The hydrogen gettering structure according to claim 14, wherein the silver-doped palladium layer has a thickness of 200 Å to 1 $\mu$m.

16. The hydrogen gettering structure according to claim 7, wherein the silver-doped palladium layer has a thickness of 200 Å to 1 $\mu$m.

17. The hydrogen gettering structure according to claim 16, wherein the silver-doped palladium layer has a thickness of 500 Å to 5000 Å.

18. The hydrogen gettering structure according to claim 7, wherein the silver is distributed uniformly through the silver-doped palladium layer.

19. A module component for packaging a semiconductor device, comprising a packaging component for packaging the semiconductor device, and the hydrogen gettering structure according to claim 7 affixed to the packaging component, with the titanium member of the hydrogen gettering structure being closer to the packaging component than the silver-doped palladium layer is to the packaging component.

20. The module component according to claim 19, wherein the silver-doped palladium layer is adapted to be exposed to the inside of a module formed that includes the module component.

21. The module component according to claim 19, wherein the hydrogen gettering structure is affixed to the packaging component by epoxy adhesive.

22. The module component according to claim 19, wherein the hydrogen gettering structure is affixed to the packaging component by a process selected from the group consisting of soldering, laser welding and direct current welding.

23. The module component according to claim 19, wherein the packaging component is a lid of a module formed using the module component.

24. A module component for packaging a semiconductor device, comprising a packaging component for packaging the semiconductor device, and the hydrogen gettering structure according to claim 1 affixed to the packaging component, with the member of the metal for absorbing hydrogen, of the hydrogen gettering structure, being closer to the packaging component than the metal-doped palladium layer is to the packaging component.

25. The module component according to claim 24, wherein the metal-doped palladium layer is adapted to be exposed to the inside of a module formed that includes the module component.

26. A semiconductor device module, comprising:
   a housing for a semiconductor device, the housing including the module component according to claim 24; and
   a semiconductor device within the housing.

27. The semiconductor device module according to claim 26, wherein the semiconductor device includes III–V semiconductor material.

28. The semiconductor device module according to claim 26, wherein the semiconductor device includes a millimeter wave integrated circuit.

29. A semiconductor device module, comprising:
   a housing for a semiconductor device, the housing including the module component according to claim 19; and
   a semiconductor device within the housing.

30. The semiconductor device module according to claim 29, wherein the semiconductor device includes a millimeter wave integrated circuit.

31. A method of forming hydrogen gettering structure, comprising:
   providing a member of a metal for absorbing hydrogen; and
   depositing on said member a metal-doped palladium layer, the metal dopant of the metal-doped palladium layer being selected from the group consisting of silver, rubidium and rhodium and being included in an amount sufficiently low such that the metal dopant does not form an alloy with the palladium, the metal for absorbing hydrogen being different than palladium.

32. The method according to claim 31, wherein the deposited metal-doped palladium layer includes at least 0.1% by weight of the metal dopant.

33. The method according to claim 31, wherein the deposited metal-doped palladium layer includes 0.1%–10% by weight of the metal dopant.

34. The method according to claim 31, wherein the metal for absorbing hydrogen is titanium.

35. The method according to claim 31, wherein the metal-doped palladium layer is deposited by sputtering.

36. The method according to claim 35, wherein the sputtering is performed using a target of palladium and the metal dopant.

37. The method according to claim 31, wherein the metal-doped palladium layer is deposited by vacuum evaporation.

38. The method according to claim 31, wherein the vacuum evaporation is an electron beam evaporation.

39. The method according to claim 31, wherein said member of a metal for absorbing hydrogen is a sheet of said metal for absorbing hydrogen.

40. A method of forming hydrogen gettering structure, comprising:

providing a titanium member; and depositing a silver-doped palladium layer on the titanium member, wherein the silver-doped palladium layer includes 0.1 to 10% by weight silver.

41. The method according to claim 40, wherein the titanium member is a sheet of titanium, and the silver-doped palladium layer is deposited on one side of the sheet of titanium.

42. The method according to claim 41, comprising the further step of depositing a layer of gold on the side of the sheet of titanium opposite said one side.

43. The method according to claim 40, wherein the silver-doped palladium layer is deposited by sputtering.

44. The method according to claim 43, wherein the sputtering is performed using a PdAg target.

45. The method according to claim 40, wherein the silver-doped palladium layer is deposited by electron beam evaporation.

46. A method of fabricating a module component for a semiconductor device module, comprising:

providing a member of a metal for absorbing hydrogen; and depositing a palladium layer doped with a metal dopant on the member, the metal dopant being selected from the group consisting of silver, rubidium and rhodium and being included in an amount sufficiently low such that the metal dopant does not form an alloy with the palladium, the metal for absorbing hydrogen being different than palladium, thereby forming hydrogen gettering structure; and affixing the hydrogen gettering structure to a packaging component of the semiconductor device module.

47. The method according to claim 46, wherein the packaging component is a lid of the semiconductor device module.

48. The method according to claim 46, wherein the laminate is affixed to the packaging component by a process selected from the group consisting of soldering, laser welding and direct current welding.

49. The method according to claim 48, wherein the soldering is performing using an eutectic solder.

50. The method according to claim 46, wherein the laminate is affixed to the packaging component by an epoxy adhesive.

51. A method of fabricating a module component of a semiconductor device module, comprising:

providing a titanium member;

depositing a silver-doped palladium layer on the titanium member, wherein the silver-doped palladium layer includes 0.1 to 10% by weight silver, thereby forming hydrogen gettering structure; and affixing the hydrogen gettering structure to a packaging component of the semiconductor device module.

52. The method according to claim 51, wherein the titanium member is a sheet of titanium, and the silver-doped palladium layer is deposited on one side of the sheet of titanium.

53. The method according to claim 52, comprising the further step, in forming the hydrogen gettering structure, of forming a layer of gold on the side of the titanium sheet opposite to said one side.

54. The method according to claim 53, wherein the hydrogen gettering structure is affixed to the packaging component by a process selected from the group consisting of soldering, laser welding and direct current welding, with the gold layer of the hydrogen gettering structure closest to the packaging component.

55. The method according to claim 51, wherein the hydrogen gettering structure is affixed to the packaging component by an epoxy adhesive.

56. The method according to claim 51, including the further step of cutting the titanium member to fit the packaging component.

57. The method according to claim 51, wherein in affixing the hydrogen gettering structure to the packaging component, the titanium member is positioned closer to the packaging component than is the silver-doped palladium layer.

* * * * *